(12) United States Patent
Chen

(10) Patent No.: US 7,140,886 B1
(45) Date of Patent: Nov. 28, 2006

(54) CONTACT TERMINAL STRUCTURE

(75) Inventor: Wan-Tien Chen, Taipei (TW)

(73) Assignee: Egbon Electronics Ltd, Taipei (TW)

( * ) Notice: Subject to any disclaimer, the term of this patent is extended or adjusted under 35 U.S.C. 154(b) by 0 days.

(21) Appl. No.: 11/127,227

(22) Filed: May 12, 2005

(51) Int. Cl.
*H01R 12/00* (2006.01)

(52) U.S. Cl. ...................................................... 439/83

(58) Field of Classification Search .................. 439/83, 439/876

See application file for complete search history.

(56) References Cited

U.S. PATENT DOCUMENTS 6,155,845 A * 12/2000 Lin et al. ....................... 439/83

6,530,788 B1 * 3/2003 Ju ................................ 439/83

\* cited by examiner

*Primary Examiner*—Ross Gushi
(74) *Attorney, Agent, or Firm*—Lowe Hauptman & Berner, LLP

(57) ABSTRACT

An improvement on a contact terminal structure to be disposed into the terminal block on the base of an integrated circuit, comprises a main body, a soldering end extending vertically from one end of said main body and providing with an aligning portion of an arcuate hollow shape for placing a solder ball, a supporting portion extending vertically from said main body and being used for supporting said solder ball, and a contact end extending vertically from another end of said main body and providing contortedly with a corresponding contact portion at an appropriate position thereon. This structure can allow said solder ball bond more precisely with said soldering portion on said contact terminal.

1 Claim, 3 Drawing Sheets

CONTACT TERMINAL STRUCTURE

BACKGROUND OF THE INVENTION

1. Field of the Invention

The invention relates to an improvement on a contact terminal structure, more particularly to a structure for solving the problem of the bonding and alignment between a solder ball and a contact terminal such that the solder ball can be more easily and precisely bonded with the contact terminal.

2. Description of the Prior Art

It is known, in the past, the contact bonding between a base and a motherboard in an integrated circuit was in a manner of mounting before soldering. But at present, the contact bonding is gradually adopting a manner of placing a solder ball on a contact terminal in an integrated circuit base first, and then soldering the integrated circuit base on a motherboard directly by means of a soldering process.

A structure as disclosed in U.S. Pat. No. 6,267,615 comprising a contact terminal consisted essentially of a base part, a wing part, a flexible arm, a holding part and a supporting part, wherein said wing part was provided contortedly on appropriate positions over both sides of the base part, wherein ends of two wing parts were extended upwardly and separately resulting into a tapered flexible arm, and wherein said holding part had an asymmetric guiding face.

In the structure as disclosed in U.S. Pat. No. 6,267,615, the supporting part of said contact terminal was a plane without any alignment structure, and therefore, the solder ball could not be aligned precisely during placing. Consequently, this structure could not give a correct electrical contact between the base and the motherboard of an integrated circuit, too.

Currently, a contact terminal commercially available is in a form that is provided with a long hole and bended into a clamp-like shape, wherein said long hole on the contact terminal is used for mounting a pin on the integrated circuit board, and wherein its solder ball is placed on the open end of the contact terminal.

However, there are several disadvantages associated with this kind of contact terminal because the bonding between the contact terminal and the solder ball is relatively uneasy to be done and a fluctuation tends to be caused between adjacent solder balls and the solder ball tends to drop off during its placing. Furthermore, no aligning structure exists between the contact terminal and the base such that after mounting the contact terminal into the terminal block on the base, a fluctuation could be caused. Consequently, in view of the foregoing, it is evident that this prior art structure could not result in a correct contact between the base and the motherboard of an integrated circuit.

SUMMARY OF THE INVENTION

A main objective of the invention is to solve and/or avoid above-described disadvantages associated with the prior art, and make possible bonding more easily and precisely for the solder ball with the soldering portion on the contact terminal.

To achieve the above-mentioned objective, the invention provides an improvement on a contact terminal structure consisted of a main body; a soldering end extended from said main body and being used for placing a solder ball; a supporting portion provided vertically on said main body; and a contact end extended vertically from said main body, thereby a soldering ball can be bonded more precisely with said soldering portion on said contact terminal.

These features, effects, advantages and technical content of the contact terminal according to the present invention will be fully understood and appreciated from the following detailed description of the accompanying drawings.

DETAILED DESCRIPTION OF THE PREFERRED EMBODIMENT

Figure 1:
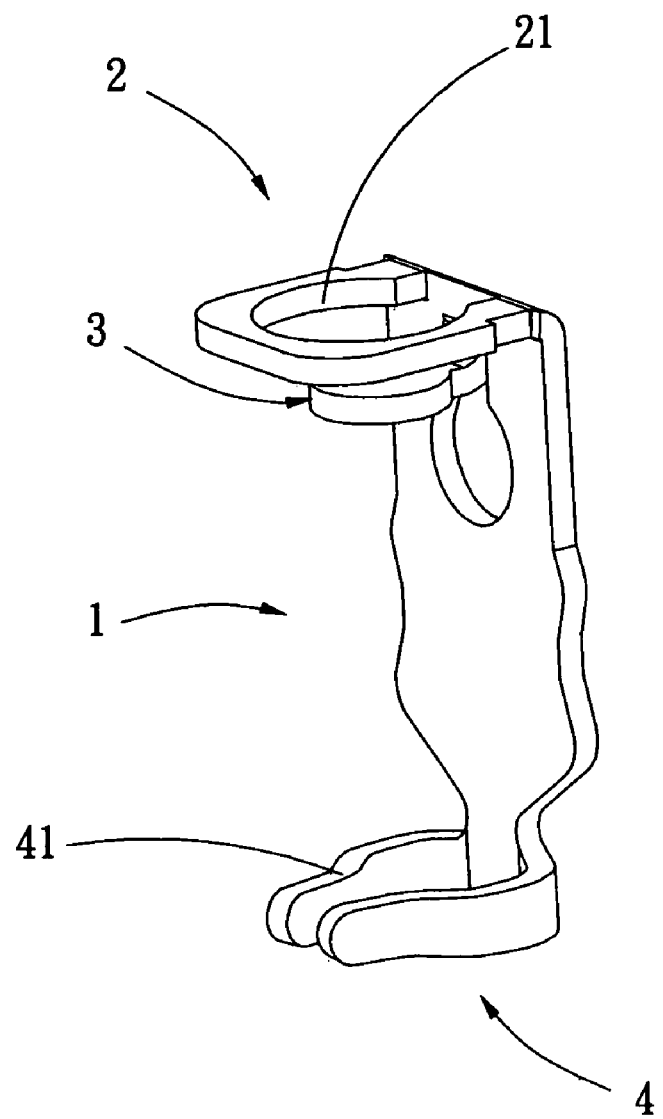
FIG. 1 is a perspective schematic view of an embodiment of the improvement on a contact terminal according to the invention.
Figure 2:
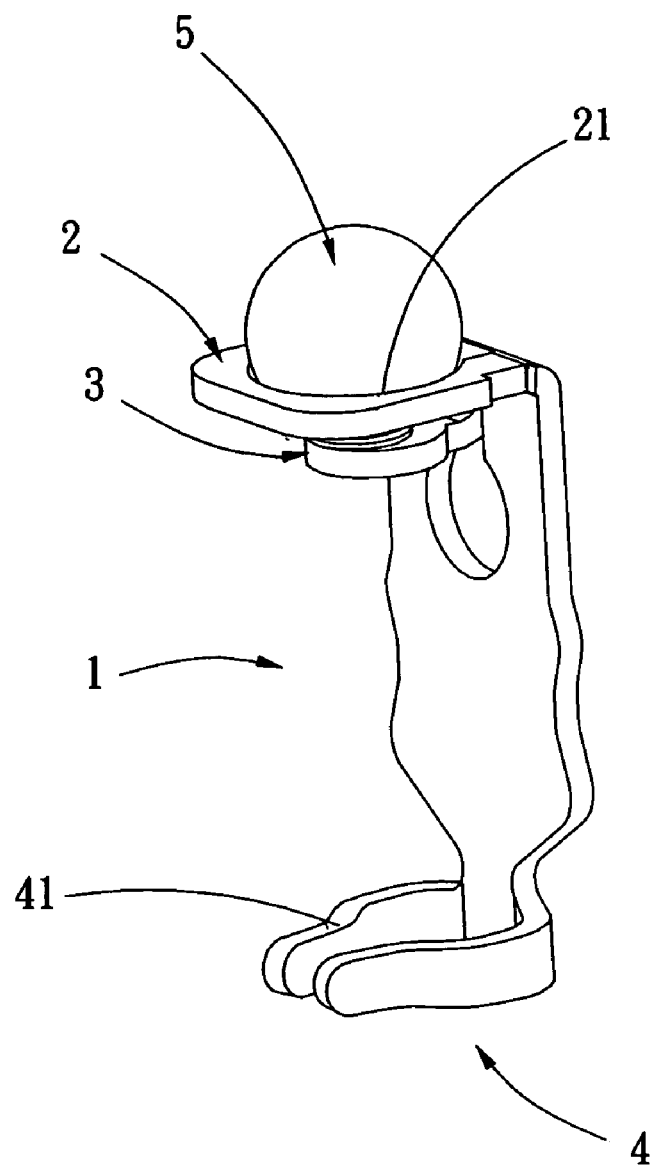
FIG. 2 is a schematic view showing the practice of an embodiment of the improvement on the contact terminal according to the invention.
Figure 3:
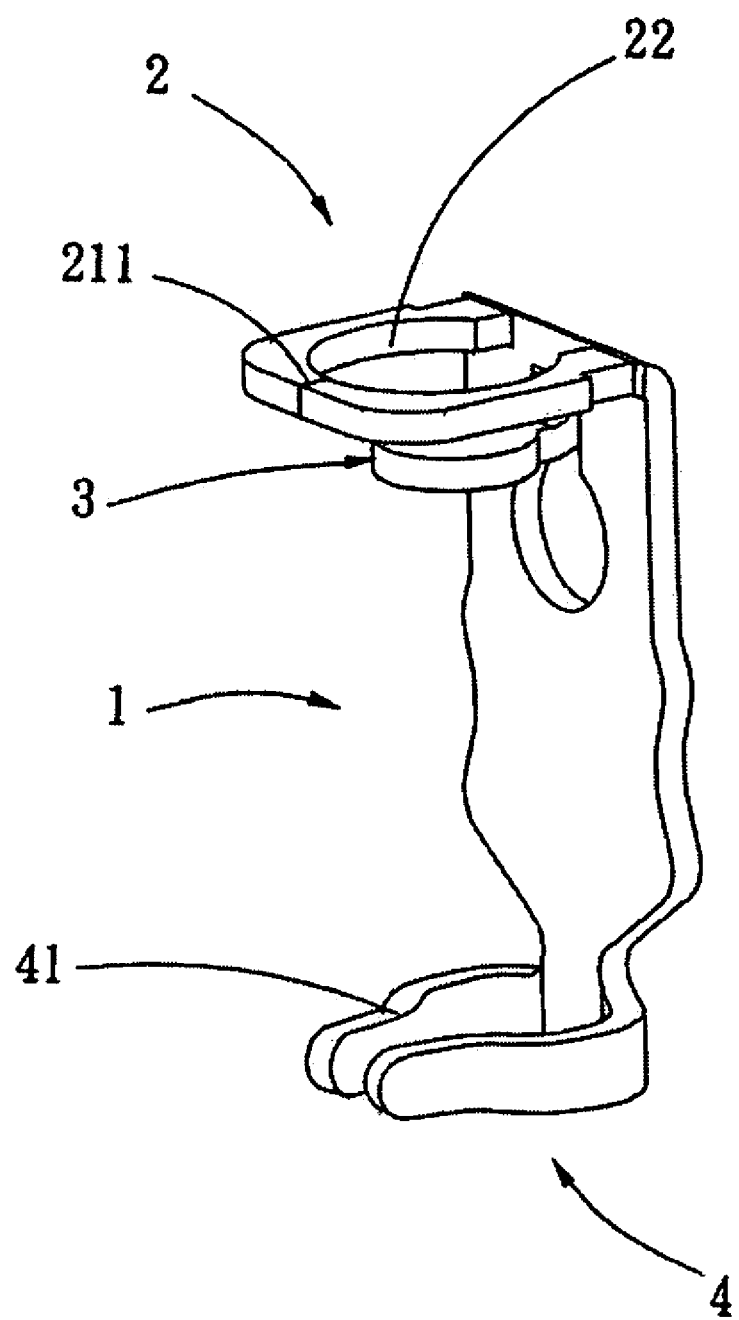
FIG. 3 is a perspective schematic view of another embodiment of the improvement on a contact terminal according to the invention.

Referring to FIGS. 1 and 2, showing schematically the perspective view and the practice of an embodiment of a contact terminal structure according to the invention, respectively, said contact terminal structure comprises:

a main body 1; and a soldering end 2, extending vertically from one end of said main body 1 and providing with an aligning portion 21 of an arcuate hollow shape for placing a solder ball 5, wherein the periphery of said aligning portion 21 may be in a rounded concave form 22 (FIG. 3); and a supporting portion 3, formed from said main body 1 by a stamping process, whereby, as said solder ball 5 is placed in said aligning portion 21, said solder ball 5 will be stopped at said supporting portion 3 in a manner such that the placing depth of said solder ball 5 can be controlled, wherein said supporting portion 3 is provided adjacent to the inner side of said soldering portion 2; and a contact end 4, extending from another end of said main body 1 and provided contortedly with a corresponding contact portion 41 at an appropriate position thereon.

Alternatively, during placing said solder ball 5, a flux can be applied on said supporting portion 3 to facilitate the alignment of said solder ball 5.

Further, since the size of said solder ball 5 is impossible to be completely consistent, in order to place smoothly a larger solder ball 5 into said aligning portion 21 and stop it against said supporting portion 3, the free end of said aligning portion 21 can be broken into a breaking line 211 (referring to FIG. 3) such that said aligning portion 21 can have a defined divergent angle so as to place in smoothly a larger solder ball 5.

As described above, by means of the contact terminal according to the invention, a solder ball can drop more easily onto a pre-determined position during placing, and consequently, the solder ball can be bonded intimately with the contact terminal during reflowing.

As understood from the foregoing, the improvement on a contact terminal structure according to the invention can eliminate effectively various disadvantages associated with the prior art structure, and give improvements as well as more usefulness, thereby meets the requirement of patentability. While the foregoing has described preferred embodiments according to the invention, the scope of the invention is understood to be not limited thereto. Further, all of equivalent changes and modifications that can be made without departing from the scope of the invention are intended to fall within the scope of the invention as defined in the appended claims.

What is claimed is:

1. An improvement on a contact terminal structure to be disposed into the terminal block on the base of an integrated circuit, comprising:

an open sided main body having an elongated flat rear structure, an upper portion and a lower portion; and a generally horizontal flat soldering end disposed in said upper portion and extending outwardly from one end of said upper portion of said main body and provided with an aligning portion of an arcuate hollow shape with a round concave periphery for placing a solder ball; and a supporting portion disposed below said aligning portion and extending outwardly from an appropriate position on said rear structure in parallel relationship with said solder end and being used for supporting said solder ball;

a contact end disposed in said lower portion and extending outwardly from and integral with a bottom end of said rear structure and provided contortedly with a corresponding contact portion at an appropriate position thereon;

wherein during placing a solder ball, a flux is applied on said supporting portion to facilitate the alignment of said solder ball; and wherein in order to place more smoothly a larger solder ball into said aligning portion and stop it against said supporting portion, the free end of said aligning portion can be broken into a breaking line such that said aligning portion has a defined divergent angle so as to place in smoothly said larger solder ball.

* * * * *